(12) United States Patent
Ueno et al.

(10) Patent No.: US 7,767,309 B2
(45) Date of Patent: Aug. 3, 2010

(54) IMPRINTING MOLD AND PROCESS FOR ITS PRODUCTION

(75) Inventors: Katsuya Ueno, Chiyoda-ku (JP); Yasuhide Kawaguchi, Chiyoda-ku (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 12/511,215

(22) Filed: Jul. 29, 2009

(65) Prior Publication Data

US 2009/0285927 A1    Nov. 19, 2009

Related U.S. Application Data

(63) Continuation of application No. PCT/JP2008/050826, filed on Jan. 22, 2008.

(30) Foreign Application Priority Data

Feb. 7, 2007  (JP) .............................. 2007-028268

(51) Int. Cl.
*B29C 33/62* (2006.01)
*B29C 33/64* (2006.01)
*B32B 9/04* (2006.01)

(52) U.S. Cl. ............... 428/447; 106/38.22; 106/287.12; 106/287.13; 106/287.15; 106/287.16; 264/220; 425/436 R; 427/387

(58) Field of Classification Search ............ 106/287.12, 106/287.13, 287.15, 287.16, 38.22; 427/387; 428/447; 264/218, 220; 425/436 R See application file for complete search history.

(56) References Cited

U.S. PATENT DOCUMENTS 6,183,872 B1 * 2/2001 Tanaka et al. ............... 428/429

FOREIGN PATENT DOCUMENTS

| JP | 5339007 A | 12/1993 |
| JP | 10113936 A | 5/1998 |
| JP | 2002-283354 | 10/2002 |

* cited by examiner

*Primary Examiner*—D. S Nakarani
(74) *Attorney, Agent, or Firm*—Oblon, Spivak, McClelland, Maier & Neustadt, L.L.P.

(57) ABSTRACT

To provide an imprinting mold, of which a coating layer formed on its surface is hardly susceptible to peeling, and a process for its production.

An imprinting mold comprising a mold body and a coating layer made of a release agent, formed on the surface of the mold body, wherein the release agent contains a compound of the following formula (1), and a process for its production:

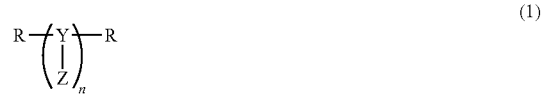

(1)

wherein R is Rf—X—, both R are the same group, Rf is a perfluoroalkyl group, X is at least one member selected from —(OC$_3$F$_6$)—, —(OC$_2$F$_4$)— and —(OCF$_2$)—, provided that the sum of such units is at least 1, Y is an organic group, is an average of n is from 2 to 10, Z is —Si(R$^1$)$_m$(R$^2$)$_{3-m}$, R$^1$ is a hydroxyl group or a hydrolysable group, R$^2$ is a hydrogen atom or a hydrocarbon group, and m is from 1 to 3.

6 Claims, 1 Drawing Sheet

IMPRINTING MOLD AND PROCESS FOR ITS PRODUCTION

TECHNICAL FIELD

The present invention relates to an imprinting mold and a process for its production.

BACKGROUND ART

As a method for producing an article having a microstructure such as an optical device, a so-called imprinting method (a nano imprinting method) is known wherein a mold having a reverse structure corresponding to such a microstructure formed on its surface, is pressed against a resin material to form the microstructure on the surface of the resin material.

In the mold (hereinafter referred to as an imprinting mold) to be used for such an imprinting method, a coating layer made of a release agent is formed on the surface of the mold body in order to improve the release properties of the resin material from the mold after forming such a microstructure. As such a release agent, a compound of the following formula (2) is known (Patent Document 1):

$$C_3F_7(OCF_2CF_2CF_2)_pOC_2F_4C_2H_4—Si(OCH_3)_3 \quad (2)$$

wherein p is an integer of at least 1.

However, a coating layer made of such a release agent is inadequate in the adhesion to the mold body and is likely to be peeled from the surface of the mold body. Thus, such an imprinting mold has problems such that the useful life is short, and when such an imprinting mold is employed, it is not possible to produce an article having a microstructure with good productivity.

Patent Document 1: JP-A-2002-283354 (Example 1)

DISCLOSURE OF THE INVENTION

Object to be Accomplished by the Invention

It is an object of the present invention to provide an imprinting mold, of which a coating layer formed on its surface is hardly susceptible to peeling, and a process for its production.

Means to Accomplish the Object

The present invention is to accomplish the above object and provides the following:

1. An imprinting mold comprising a mold body and a coating layer made of a release agent, formed on the surface of the mold body, wherein the release agent contains a compound of the following formula (1):

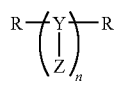
(1)

wherein R is Rf—X—, both R are the same group, Rf is a $C_{1-20}$ perfluoroalkyl group, X is a group consisting of at least one member selected from repeating units of the following formulae (u1) to (u3), provided that the sum of the repeating units is at least 1, Y is an organic group having at least two carbon atoms, an average of n is from 2 to 10, Z is —Si($R^1$)$_m$($R^2$)$_{3-m}$, $R^1$ is a hydroxyl group or a hydrolysable group, $R^2$ is a hydrogen atom or a monovalent hydrocarbon group, and m is an integer of from 1 to 3:

—(OC$_3$F$_6$)— (u1)

—(OC$_2$F$_4$)— (u2)

—(OCF$_2$)— (u3)

provided that C$_3$F$_6$ and C$_2$F$_4$ may be linear or branched.

2. The imprinting mold according to the above 1, wherein the contact angle of the coating layer to water is at least 90°.

3. The imprinting mold according to the above 1 or 2, wherein the sum of the repeating units of the above formulae (u1) to (u3) is from 2 to 20.

4. The imprinting mold according to any one of the above 1 to 3, wherein Y is a group of the following formula (g1):

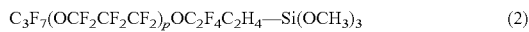
(g1)

5. A process for producing the imprinting mold as defined in any one of the above 1 to 4, which comprises a step of cleaning the mold body, a step of forming a film of the release agent on the surface of the mold body, and a step of heating the film of the release agent to form a coating layer.

6. A release agent solution for an imprinting mold, which comprises a compound of the following formula (1) and a solvent:

(1)

wherein R is Rf—X—, both R are the same group, Rf is a $C_{1-20}$ perfluoroalkyl group, X is a group consisting of at least one member selected from repeating units of the following formulae (u1) to (u3), provided that the sum of the repeating units is at least 1, Y is an organic group having at least two carbon atoms, an average of n is from 2 to 10, Z is —Si($R^1$)$_m$($R^2$)$_{3-m}$, $R^1$ is a hydroxyl group or a hydrolysable group, $R^2$ is a hydrogen atom or a monovalent hydrocarbon group, and m is an integer of from 1 to 3:

—(OC$_3$F$_6$)— (u1)

—(OC$_2$F$_4$)— (u2)

—(OCF$_2$)— (u3)

provided that C$_3$F$_6$ and C$_2$F$_4$ may be linear or branched.

EFFECTS OF THE INVENTION

According to the imprinting mold of the present invention, the coating layer formed on its surface is hardly susceptible to peeling from the mold body. According to the process for producing the imprinting mold of the present invention, it is possible to easily produce an imprinting mold, of which the coating layer formed on its surface is hardly susceptible to peeling from the mold body.

MEANINGS OF SYMBOLS

10: Mold
12: Mold body
14: Coating layer
20: Substrate
22: Resin material layer

BEST MODE FOR CARRYING OUT THE INVENTION

In this specification, a compound of the formula (1) will be referred to as compound (1). Compounds of other formulae will also be referred to in the same manner. Further, a repeating unit of the formula (u1) will be referred to as unit (u1). Repeating units of other formulae will also be referred to in the same manner. Further, a group of the formula (g1) will be referred to as group (g1). Groups of other formulae will also be referred to in the same manner.

Mold

Figure 1:
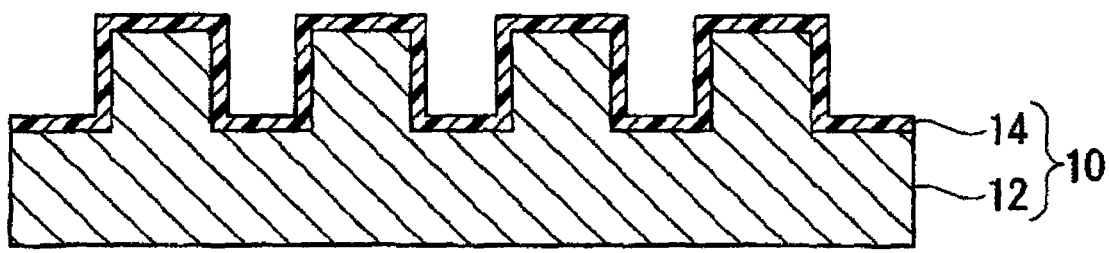
FIG. 1 is a cross sectional view illustrating an embodiment of the mold of the present invention.

FIG. 1 is a cross sectional view illustrating an embodiment of the imprinting mold (hereinafter referred to as the mold) of the present invention. The mold 10 comprises a mold body 12 and a coating layer 14 formed on the surface of the mold body 12.

Mold Body

The shape of the mold body 12 may, for example, be a sheet-form, a plate-form, a cylindrical form or a columnar form.

The material for the mold body 12 may be a material chemically reactive with the —Z group of compound (1). Such a material, may, for example, be quartz, silicon having a silicon carbide film formed by a chemical vapor deposition method, single-crystal silicon carbide, tantalum, silicon, silicon having a silicon oxide film formed thereon, silicon having a silicon nitride film formed thereon, nickel, copper, stainless steel or titanium. Nickel or copper is preferred in that electroplating can be carried out i.e. a mold body can be prepared at a low cost.

The mold body 12 has a microstructure on its surface. Such a microstructure is a reverse structure corresponding to the microstructure of an article (such as an optical device) to be produced by the imprinting method.

The microstructure means fine convexes and/or concaves.

Such convexes may, for example, be long convex lines present on the surface of the mold body 12 or protrusions formed on the surface.

Such concaves may, for example, be long grooves present on the surface of the mold body 12 or recesses formed on the surface.

The shapes of the convex lines or the grooves may, for example, be linear, curved or bent shapes. The convex lines or the grooves may be in the form of a plurality of stripes present in parallel with one another.

The cross sectional shape of a convex or a groove in a direction perpendicular to the longitudinal direction may, for example, be rectangular, trapezoidal, triangular or semi-circular. The shape of a protrusion or a recess may, for example, be triangular prism, quadrangular prism, six-sided prism, cylindrical column, triangular pyramid, quadrangular pyramid, six-sided pyramid, conical hemisphere or polyhedron.

The width of a convex or a groove is preferably from 1 nm to 400 nm, particularly preferably from 30 nm to 200 nm, on an average. The width of a convex means the length of the base in the cross section in a direction perpendicular to the longitudinal direction. The width of a groove means the length of the upper side in the cross section in a direction perpendicular to the longitudinal direction.

The width of a protrusion or a recess is preferably from 1 nm to 400 nm, particularly preferably from 30 nm to 200 nm, on an average. The width of a protrusion means, in a case where the basal shape is elongated, the length of the base in the cross section in a direction perpendicular to the longitudinal direction, and in other cases, the maximum length at the base of a protrusion. The width of a recess means, in a case where the opening is elongated, the length of the upper side in the cross section in a direction perpendicular to the longitudinal direction, and in other cases, the maximum length at the opening of the recess.

The height of a projection is preferably from 1 nm to 4 μm, more preferably from 1 nm to 1 μm, further preferably from 1 nm to 400 nm, still further preferably from 10 nm to 400 nm, particularly preferably from 30 nm to 200 nm, on an average.

The depth of a recess is preferably from 1 nm to 4 μm, more preferably from 1 nm to 1 μm, further preferably from 1 nm to 400 nm, still further preferably from 10 nm to 400 nm, particularly preferably from 30 nm to 200 nm, on an average.

In a region where microstructures are densely present, the spacing between the adjacent convexes (or concaves) is preferably from 1 nm to 10 μm, more preferably from 10 nm to 1 μm, particularly preferably from 30 nm to 200 nm, on an average. The spacing between the adjacent convexes means the distance from the end point of the base in the cross section of a convex to the start point of the base in the cross section of the adjacent convex. The spacing between the adjacent concaves means the distance from the end point of the upper side in the cross section of a concave to the start point of the upper side in the cross section of the adjacent concave.

The minimum dimension of a convex is preferably from 1 nm to 400 nm, more preferably from 30 nm to 200 nm. The minimum dimension means the smallest dimension among the width, the length and the height of a convex.

The minimum dimension of a concave is preferably from 1 nm to 400 nm, more preferably from 30 nm to 200 nm. The minimum dimension means the smallest dimension among the width, the length and the depth of a concave.

A method for forming microstructures may, for example, be a machining process, a lithography process, an electroplating process or an electron beam lithography process, and an electroplating method is preferred, since it is thereby possible to form nano size microstructures at a low cost.

Coating Layer

The coating layer 14 is a coating layer made of a release agent containing compound (1).

(1)

R is Rf—X—.

Rf is a $C_{1-20}$ perfluoroalkyl group, preferably a $C_{1-10}$ perfluoroalkyl group. By virtue of the perfluoroalkyl group, the release properties of the mold 10 will be excellent. When the number of carbon atoms in the perfluoroalkyl group is at most 20, the solubility of such a release agent in a diluting solvent will be improved, whereby its application to the mold body will be facilitated. The perfluoroalkyl group may be linear or branched.

The following groups are preferred as Rf:
$CF_3CF_2—$,
$CF_3(CF_2)_2—$,
$CF_3(CF_2)_3—$,
$CF_3(CF_2)_4—$,
$CF_3(CF_2)_5—$,
$CF_3(CF_2)_6—$,
$CF_3(CF_2)_7—$,
$CF_3(CF_2)_8—$,
$CF_3(CF_2)_9—$,
$CF_3(CF_2)_{10}—$,
$CF_3(CF_2)_{11}—$,
$CF_3(CF_2)_{12}—$,
$CF_3(CF_2)_{13}—$,
$CF_3(CF_2)_{14}—$,
$CF_3(CF_2)_{15}—$,
$CF_3(CF_2)_{16}—$,
$CF_3(CF_2)_{17}—$,
$CF_3(CF_2)_{18}—$,
$CF_3(CF_2)_{19}—$.

X is a group consisting of at least one member selected from the group consisting of repeating units of the following formulae (u1), (u2) and (u3):

$$—(OC_3F_6)— \quad (u1),$$

$$—(OC_2F_4)— \quad (u2),$$

$$—(OCF_2)— \quad (u3).$$

provided that $C_3F_6$ and $C_2F_4$ may be linear of branched.

The sum of the number of units (u1), the number of units (u2) and the number of units (u3) is at least 1, preferably from 2 to 20. When the sum of repeating units (u1) to (u3) is at least 1, the release properties of the mold 10 will be good. When the sum of repeating units (u1) to (u3) is at most 20, the solubility of such a release agent in a diluting solvent will be improved, whereby its application to the mold body will be easy.

The order of units (u1) to (u3) present in X is optional.

Both R are the same group. The same group means that Rf is the same, and the types, the numbers and the order in presence of units (u1) to (u3) constituting X are the same. For example, when R on the left-hand side is $C_3F_7—(OCF(CF_3)CF_2)—(OCF(CF_3)—$, R on the right-hand side is $—(CF(CF_3)O)—(CF_2CF(CF_3)O)—C_3F_7$.

The following groups are preferred as R:
$C_3F_7OCF(CF_3)—$,
$C_3F_7OCF(CF_3)CF_2OCF(CF_3)—$,
$C_3F_7\{OCF(CF_3)CF_2\}_2OCF(CF_3)—$,
$C_3F_7\{OCF(CF_3)CF_2\}_3OCF(CF_3)—$,
$C_3F_7\{OCF(CF_3)CF_2\}_4OCF(CF_3)—$,
$C_3F_7\{OCF(CF_3)CF_2\}_5OCF(CF_3)—$,
$C_4F_9OCF(CF_3)—$,
$C_4F_9OCF(CF_3)CF_2OCF(CF_3)—$,
$C_4F_9\{OCF(CF_3)CF_2\}_2OCF(CF_3)—$,
$C_4F_9\{OCF(CF_3)CF_2\}_3OCF(CF_3)—$,
$C_4F_9\{OCF(CF_3)CF_2\}_4OCF(CF_3)—$,
$C_6F_{13}OCF(CF_3)—$,
$C_6F_{13}OCF(CF_3)CF_2OCF(CF_3)—$,
$C_6F_{13}\{OCF(CF_3)CF_2\}_2OCF(CF_3)—$,
$C_6F_{13}\{OCF(CF_3)CF_2\}_3OCF(CF_3)—$,
$C_6F_{13}\{OCF(CF_3)CF_2\}_4OCF(CF_3)—$,
$C_3F_7OCF_2CF_2CF_2—$,
$C_3F_7\{OCF_2CF_2CF_2\}_2—$,
$C_3F_7\{OCF_2CF_2CF_2\}_3—$,
$C_3F_7\{OCF_2CF_2CF_2\}_4—$,
$C_3F_7\{OCF_2CF_2CF_2\}_5—$,
$C_2F_5OCF_2CF_2—$,
$C_2F_5\{OCF_2CF_2\}_2—$,
$C_2F_5\{OCF_2CF_2\}_3—$,
$C_2F_5\{OCF_2CF_2\}_4—$,
$C_2F_5\{OCF_2CF_2\}_5—$,
$C_2F_5\{OCF_2CF_2\}_6—$,
$C_2F_5\{OCF_2CF_2\}_7—$,
$C_2F_5\{OCF_2CF_2\}_8—$,
$C_2F_5\{OCF_2CF_2\}_9—$,
$C_3F_7OCF_2CF_2—$,
$C_3F_7\{OCF_2CF_2\}_2—$,
$C_3F_7\{OCF_2CF_2\}_3—$,
$C_3F_7\{OCF_2CF_2\}_4—$,
$C_3F_7\{OCF_2CF_2\}_5—$,
$C_3F_7\{OCF_2CF_2\}_6—$,
$C_3F_7\{OCF_2CF_2\}_7—$.

Y is an organic group having at least two carbon atoms. The total number of carbon atoms in Y is preferably at most 50. If the total number of carbon atoms exceeds 50, the molecular weight tends to be too large, and the solubility in a diluting solvent is likely to be low, and the proportion of a fluorine moiety occupying in the molecule tends to be low, whereby the release property is likely to deteriorate, such being undesirable. The total number of carbon atoms in Y is more preferably from 2 to 10.

Y is preferably one of groups (g1) to (g6), and more preferably group (g1), since preparation of compound (1) is thereby easy.

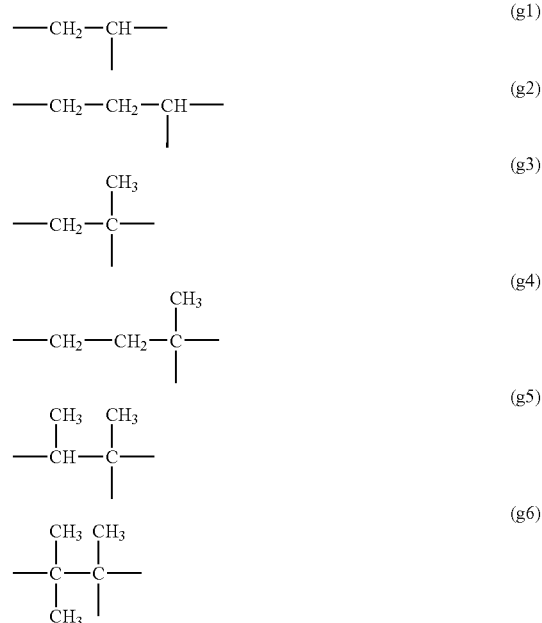

The average of n is from 2 to 10, preferably from 3 to 10.

When the average of n is 2 or more, the adhesion of the mold body 12 and the coating layer 14 will be good. When the average of n is 10 or less, it is possible to impart high release properties to the mold body by forming the coating layer on the mold body.

The compound (1) is usually a mixture of a plurality of compounds (1) differing in the number of n. Accordingly, when the compound (1) is a mixture of two or more compounds (1) differing in the number of n, n is represented as an average value. The mixture of two or more compounds (1) may contain compound (1) wherein n is 1 or compound (1) wherein n exceeds 10, within a range where the average of n is from 2 to 10.

On the other hand, in a case where the compound (1) is constituted solely by one type of compound (1) wherein the number of n is the same, such a number of n will be the average of n as it is.

The average of n is obtained by the following method.

(i) By gel permeation chromatography (GPC), the number average molecular weight (as calculated as polystyrene) of the compound (1) is obtained.

(ii) From the number average molecular weight, the molecular weight of Rf—X is subtracted to obtain the molecular weight of $(Y-Z)_n$.

(iii) The molecular weight of $(Y-Z)_n$ is divided by the molecular weight of Y—Z to obtain the average of n.

Z is $-Si(R^1)_m(R^2)_{3-m}$.

$R^1$ is a hydroxyl group or a hydrolyzable group. The hydroxyl group or the hydrolyzable group will react with the material of the mold body 12, and thus, compound (1) contained in the coating layer 14 is chemically bonded to the surface of the mold body 12.

The hydrolyzable group may, for example, be an alkoxy group, an ester group, an acetoxy group, an oxime group, an enoxy group, an amino group, an aminoxy group, an amide group or a halogen atom. From the viewpoint of the availability and efficiency in preparation of the release agent solution, a methoxy group, an ethoxy group or a fluoro group is preferred.

$R^2$ is a hydrogen atom or a monovalent hydrocarbon group. The monovalent hydrocarbon group may be a $C_{1-3}$ alkyl group.

m is an integer of from 1 to 3, and from the viewpoint of the adhesive property to the mold, it is preferably 3.

Compound (11) is preferred as compound (1).

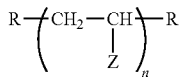

(11)

Compound (11) may, for example, be prepared by reacting compound (3) with compound (4) in a solvent in a nitrogen atmosphere.

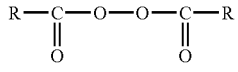

(3)

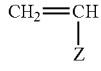

(4)

As the solvent, a halogenated aliphatic solvent or a halogenated aromatic solvent is preferred.

The halogenated aliphatic solvent may, for example, be methylene chloride, chloroform, 2-chloro-1,2-dibromo-1,1,2-trifluoroethane, 1,2-dibromohexafluoropropane, 1,2-dibromotetrafluoroethane, 1,1-difluorotetrachloroethane, 1,2-difluorotetrachloroethane, fluorotrichloromethane, heptafluoro-2,3,3-trichlorobutane, 1,1,1,3-tetrachlorotetrafluoropropane, 1,1,1-trichloropentafluoropropane, 1,1,2-trichlorotrifluoroethane, 1,1,1,2,2-pentafluoro-3,3-dichloropropane, 1,1,2,2,3-pentafluoro-1,3-dichloropropane, 1,1,1,2,2,3,3,4,4,5,5,6,6-tridecafluorohexane, 1,1,1,2,2,3,4,5,5,5-decafluoropentane, nonafluorobutyl methyl ether, nonafluorobutyl ethyl ether, heptafluorocyclopentane, 1,1,2,2-tetrafluoroethyl-2,2,2-trifluoroethyl ether, perfluorotributylamine or (1-trifluoromethyl) perfluorodecalin.

The halogenated aromatic solvent may, for example, be benzotrifluoride, hexafluoroxylene or pentafluorobenzene.

The above solvents may be used alone or in combination as a mixture of two or more of them.

As the above solvent, one of compounds (5-1) to (5-6) is preferred, since the solubility of compound (3) and compound (4) is high, it is readily available, and its reactivity with the obtainable compound (11) is low.

1,1,2,2,3-pentafluoro1,3-dichloropropane (5-1), 1,1,2-trichlorotrifluoroethane (5-2), 1,1,1,2,2,3,3,4,4,5,5,6,6-tridecafluorohexane (5-3), 1,1,2,2-tetrafluoroethyl-2,2,2-trifluoroethyl ether (5-4), perfluorotributylamine (5-5), (1-trifluoromethyl)perfluorodecalin (5-6).

The reaction temperature is preferably from 5 to 80° C.

The reaction time is preferably from 0.1 to 10 hours.

In order to adjust the average of n, the molar ratio of compound (3) to compound (4) may be adjusted.

The thickness of the coating layer 14 is preferably from 0.1 nm to 100 µm, more preferably from 1 nm to 20 nm.

The contact angle of the coating layer 14 to water is preferably at least 90°, more preferably from 95 to 130°. When the contact angle of the coating layer 14 to water is at least 90°, the release property from the resin material will be good.

The contact angle of the coating layer 14 to n-hexadecane is preferably at least 30°, more preferably from 35 to 90°. When the contact angle of the coating layer 14 to n-hexadecane is at least 30°, the release property from the resin material will be good.

The contact angle is measured in accordance with JIS R3257.

In the above-described mold 10, the release agent constituting the coating layer 14 contains compound (1), whereby the coating layer 14 is hardly susceptible to peeling from the mold body 12. Namely, in compound (1), the average of n is at least 2, the number of —Z groups reactive with the material of the mold body 12 will be large as compared with compound (2) as a conventional release agent, and compound (1) contained in the coating layer 14 is chemically firmly bonded to the surface of the mold body 12, as compared with compound (2). As a result, the coating layer 14 is hardly susceptible to peeling from the mold body 12.

Process for Producing Mold

The mold 10 is produced via the following steps (a) to (d):

(a) a step of cleaning the mold body 12, (b) a step of forming a film of the release agent on the surface of the mold body 12, (c) a step of heating the film of the release agent to form a coating layer 14 thereby to obtain a mold 10, and (d) a step of cleaning the mold 10, as the case requires.

Step (a)

As the method for cleaning the mold body 12, the following methods may be mentioned:

(a-1) a method of subjecting the mold body 12 to ultrasonic cleaning in an organic solvent, and (a-2) a method of subjecting the mold body 12 to boil-cleaning in a solution of an acid or a peroxide.

The organic solvent may, for example, be acetone, ethanol or compound (5-1).

The acid may, for example, be sulfuric acid, hydrochloric acid, sulfamic acid, formic acid, citric acid or glycolic acid.

The peroxide may, for example, be an aqueous solution of hydrogen peroxide, sodium peroxide, potassium peroxide, barium peroxide, sodium percarbonate, potassium percarbonate or barium percarbonate.

After such cleaning, it may be further cleaned with purified water, dried and then subjected to ozone irradiation to clean the surface of the mold body 12.

Step (b)

As the method for forming a film of the release agent on the surface of the mold body 12, the following methods may be mentioned:

(b-1) a method of applying a solution of the release agent to the surface of the mold body 12, and (b-2) a method of dipping the mold body 12 in a solution of the release agent.

The solution of the release agent may be prepared, for example, by diluting a solution comprising compound (1) and a solvent with a diluting solvent, as the case requires, and adding an acid thereto, as the case requires. The solution of the release agent is preferably used by adjusting the concentration as the case requires. The content of the release agent in the solution of the release agent is preferably from 0.001 to 10 mass %, more preferably from 0.005 to 5 mass %.

The above solvent is preferably the above-mentioned halogenated aliphatic solvent or the above-mentioned halogenated aromatic solvent. Among them, the above-mentioned compounds (5-1) to (5-6) are more preferred.

The diluting solvent may, for example, be 1-butanol, isopropanol, ethanol, 1-propanol or t-butanol.

The acid may, for example, be hydrochloric acid, sulfuric acid or nitric acid.

The coating method may, for example, be a spin coating method, a casting method, a spray coating method or a dip coating method.

Step (c)

The heating temperature is preferably from 20 to 180° C., particularly preferably from 50 to 180° C.

The heating time is preferably from 0.1 to 24 hours.

The atmosphere at the time of heating is preferably atmospheric air.

Step (d)

The method for cleaning the mold 10 may preferably be a method wherein the mold 10 is subjected to ultrasonic cleaning in a fluorinated solvent.

The fluorinated solvent may, for example, be compounds (5-1) to (5-6).

In the above-described process for producing the mold 10, the coating layer 14 is formed by using the release agent containing compound (1), whereby it is possible to produce the mold 10 wherein the coating layer 14 is hardly susceptible to peeling from the mold body 12.

Process for Producing Article Having Microstructure

As a process for producing an article having a microstructure, employing the mold 10, the following processes may, for example, be mentioned.

Figure 2:
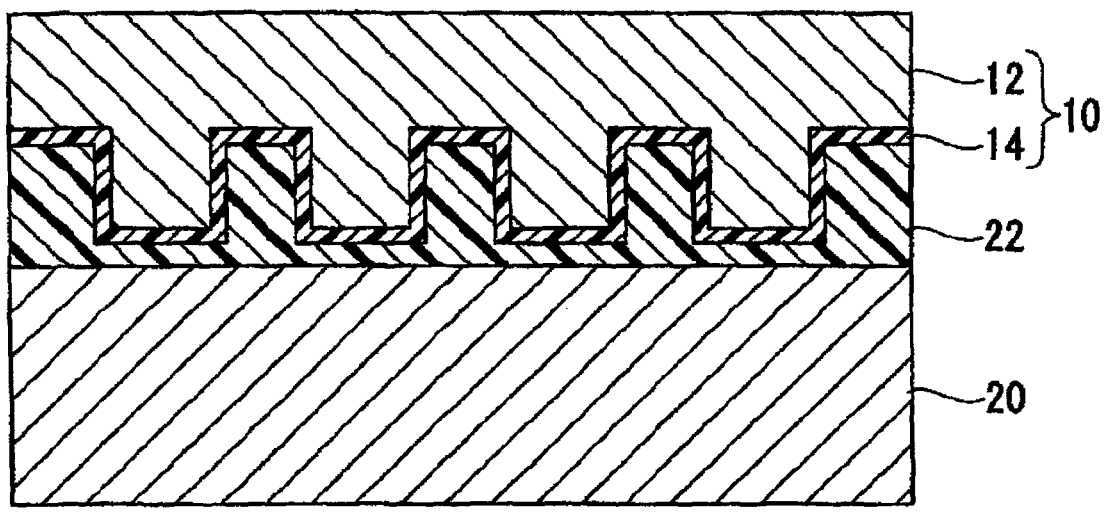
FIG. 2 is a cross sectional view illustrating an embodiment of the process for producing an article having a microstructure.

(I) A process wherein as shown in FIG. 2, the mold 10 is pressed against a resin material layer 22 made of a liquid photocurable resin formed on a substrate 20, then, in a state where the mold 10 is pressed against the resin material layer 22 or after separating the mold 10 from the resin material layer 22, the resin material layer 22 is irradiated with light to cure the photocurable resin thereby to obtain an article having a desired microstructure on the surface of the resin material layer 22.

(II) A process wherein as shown in FIG. 2, the mold 10 is pressed against a resin material layer 22 made of a thermoplastic resin, formed on a substrate 20 in a state where the resin material layer 22 is heated to at least the glass transition temperature of the thermoplastic resin, and then, in a state where the mold 10 is pressed against the resin material layer 22 or after separating the mold 10 from the resin material layer 22, the resin material layer 22 is cooled to bring the thermoplastic resin to be solid thereby to obtain an article having a desired microstructure on the surface of the resin material layer 22.

The shape of the substrate may, for example, be a film or sheet-form, a plate-form, a cylindrical form or a columnar form.

The material for the substrate may, for example, be a resin, glass, metal or cellulose base material.

The photocurable resin may, for example, be a known photocurable resin which is curable by visible light ray or ultraviolet ray.

As the article having a microstructure, the following articles may be mentioned.

Optical devices: a microlens array, an optical waveguide, an optical switching, a liquid crystal alignment film, a Fresnel zone plate, a wire grid, a wavelength filter, a polarizer, a binary element, blazed element, a photonic crystal, an anti-reflection film, a component provided with an anti-reflection structure, etc.

Chips: a biochip, a chip for µ-TAS (Micro-Total Analysis Systems), a microreactor chip, etc.

Recording media: an optical disk, etc.

Display materials: a rib, etc.

Energy related articles: a fuel cell, a secondary cell, a capacitor, a peltiert device, a solar cell, etc.

Semiconductor related articles: MEMS (Micro-Electro-Mechanical-System), a semiconductor device, etc.

Other articles: a support for a catalyst, a filter, a sensor component, an ultra-water repellent material, etc.

EXAMPLES

Now, the present invention will be described in further detail with reference to Examples, but it should be understood that the present invention is by no means restricted to such Examples.

Examples 1 and 4 are Working Examples of the present invention, and Examples 2, 3 and 5 are Comparative Examples.

Contact Angle

The contact angle of the coating layer to water or to n-hexadecane was measured in accordance with JIS R3257, by using a contact angle meter (CA-X150 model, manufactured by Kyowa Interface Science Co., LTD.) and by letting 4 µL of water or n-hexadecane deposit on the surface of the coating layer.

Durability

By exerting a load of 0.5 kg, a JK wiper (150-S, manufactured by NIPPON PAPER CRECIA Co., LTD.) was reciprocated 100 times on the surface of the coating layer to carry out a wiping test. After the test, the contact angle of the coating layer to water or n-hexadecane was measured, and from the change in the contact angle between before and after the test, the durability of the coating layer was evaluated.

Nano Imprinting Test

A mold having a release layer formed thereon and, as a substrate to be molded, ZEONOR (registered trademark of Zeon Corporation) were set in a nano imprinting apparatus, and the mold was heated to 170° C. The mold was pressed against the substrate to be molded with a force of 1,000 N and held in that state for 120 seconds. The mold was cooled to 120° C., and the mold was separated from the substrate to be molded. From the change in the contact angle after the test, the durability of the coating layer was evaluated.

Example 1

Into a 100 mL round-bottomed flask equipped with a condenser tube, 0.74 g (5.0 mmol) of compound (4-1) was put, and further, into the flask, 45.71 g of a solution containing 4.97 g (5.0 mmol) of compound (3-1) in compound (5-1) was put, followed by a reaction at 50° C. for two hours in a nitrogen atmosphere.

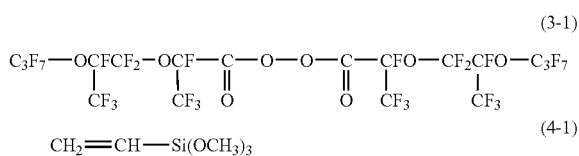

After completion of the reaction, the reaction crude solution was filtered through a filter to obtain 27.2 g of a solution containing compound (11-1) in compound (5-1).

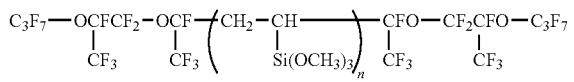

The concentration of compound (11-1) in the solution was 10.2 mass %. The number average molecular weight (as calculated as polystyrene) of compound (11-1) was measured by GPC, and the average of n was calculated, whereby the average of n was 2.8.

1 g of such a solution was added to 9.18 g of 1-butanol, and 0.018 g of hydrochloric acid was further added to prepare a release agent solution.

As a mold body, a nickel substrate was prepared, and the nickel substrate was subjected to ultrasonic cleaning in acetone.

On the surface of the nickel substrate, the release agent solution was applied by spin coating at a rotational speed of 500 rpm for 10 seconds and then at 2,000 rpm for 20 seconds to form a film of the release agent.

The film of the release agent was heated at 150° C. for one hour together with the nickel substrate to form a coating layer on the surface of the nickel substrate thereby to obtain a mold.

The mold was subjected to ultrasonic cleaning in compound (5-1), and then, the contact angle of the coating layer to water or to n-hexadecane was measured. Further, after the wiping test, the contact angle of the coating layer to water or to n-hexadecane was measured. No peeling of the coating layer was observed. The results are shown in Table 1.

Example 2

Into a 100 mL round-bottomed flask equipped with a condenser tube, 0.099 g (0.67 mmol) of compound (4-1) was put, and further, into the flask, 63.99 g of a solution containing 6.6 g (6.7 mmol) of compound (3-1) in compound (5-1) was put, followed by a reaction at 50° C. for two hours in a nitrogen atmosphere.

After completion of the reaction, the reaction crude solution was filtered through a filter, to obtain 63.2 g of a solution containing compound (11-1) in compound (5-1).

The concentration of compound (11-1) in the solution was 4.2 mass %. The number average molecular weight (as calculated as polystyrene) of compound (11-1) was measured by GPC, and the average of n was calculated, whereby the average of n was 17.0.

1 g of such a solution was added to 3.2 g of isopropyl alcohol to prepare a release agent solution.

As a mold body, a nickel substrate was prepared, and the nickel substrate was subjected to ultrasonic cleaning in acetone.

On the surface of the nickel substrate, the release agent solution was applied by spin coating at a rotational speed of 700 rpm for 20 seconds to form a film of the release agent.

The film of the release agent was heated at 150° C. for one hour together with the nickel substrate to form a coating layer on the surface of the nickel substrate thereby to obtain a mold.

The mold was subjected to ultrasonic cleaning in compound (5-1), and then, the contact angle of the coating layer to water was measured and found to be 66.0°, whereby no water repellency was ascertained. The results are shown in Table 1.

Example 3

A solution (Optool DSX, manufactured by Daikin Industries, Ltd.) containing 1 mass % of compound (2) in perfluorohexane, was prepared, and such a solution was used as a release agent solution.

As a mold body, a nickel substrate was prepared, and such a nickel substrate was subjected to ultrasonic cleaning in acetone.

On the surface of the nickel substrate, the release agent solution was applied by spin coating at a rotational speed of 500 rpm for 10 seconds to form a film of the release agent.

The film of the release agent was heated at 150° C. for one hour together with the nickel substrate to form a coating layer on the surface of the nickel substrate thereby to obtain a mold.

The mold was subjected to ultrasonic cleaning in compound (5-1), and then, the contact angle of the coating layer to water or to n-hexadecane was measured. Further, after the wiping test, the contact angle of the coating layer to water or to n-hexadecane was measured. The results are shown in Table 1. The contact angle after the test was close to the contact angle (water: 76°, n-hexadecane: less than 10°) of the nickel substrate, whereby peeling of the coating layer was ascertained.

TABLE 1

| | Contact angle before wiping test (degree) | | Contact angle after wiping test (degree) | |
|---|---|---|---|---|
| | Water | n-hexadecane | Water | n-hexadecane |
| Ex. 1 | 108 | 52 | 99 | 50 |
| Ex. 2 | 66.0 | — | — | — |
| Ex. 3 | 110 | 54 | 78 | 28 |

Example 4

A reaction was carried out in the same manner as in Example 1 to obtain 30.5 g of a solution containing compound (11-1).

The concentration of compound (11-1) in the solution was 8.2 mass %. The number average molecular weight (as calculated as polystyrene) of compound (11-1) was measured by GPC, and the average of n was calculated, whereby the average of n was 4.1.

1 g of such a solution was added to 8.118 g of isopropyl alcohol to prepare a release agent solution.

As a mold body, the following substrate was prepared.

A substrate having nickel sputtered on a silicon wafer having a size of 10 mm×10 mm to cover the surface with nickel.

Such a substrate was subjected to ultrasonic cleaning in acetone.

On the surface of such a substrate, the release agent solution was applied by spin coating at a rotational speed of 700 rpm for 10 seconds to form a film of the release agent.

The film of the release agent was heated at 80° C. in a relative humidity of 90% for one hour together with the substrate and further heated at 150° C. for one hour together with the substrate to form a coating layer on the surface of the substrate thereby to obtain a mold.

The mold was subjected to ultrasonic cleaning in compound (5-1), and then, the contact angle of the coating layer to water was measured. Further, after 50 times of the nano imprinting test, the contact angle of the coating layer to water was measured. The results are shown in Table 2. No peeling of the coating layer was observed.

Example 5

A solution (Optool DSX, manufactured by Daikin Industries, Ltd.) containing 1 mass % of compound (2) in perfluorohexane, was prepared, and such a solution was used as a release agent solution.

As a mold body, the following substrate was prepared.

A substrate having nickel sputtered on a silicon wafer having a size of 10 mm×10 mm to cover the surface with nickel.

Such a substrate was subjected to ultrasonic cleaning in acetone.

On the surface of such a substrate, the release agent solution was applied by spin coating at a rotational speed of 700 rpm for 10 seconds to form a film of the release agent.

The film of the release agent was heated at 80° C. in a relative humidity of 90% for one hour together with the substrate to form a coating layer on the surface of the substrate thereby to obtain a mold.

The mold was subjected to ultrasonic cleaning in compound (5-1), and then, the contact angle of the coating layer to water was measured. Further, after 50 times of the nano imprinting test, the contact angle of the coating layer to water was measured. The results are shown in Table 2. Deposition of the resin to be molded on the mold was confirmed.

TABLE 2

|  | Contact angle to water before nano imprinting (degree) | Contact angle to water after nano imprinting (degree) |
|---|---|---|
| Ex. 4 | 93.7 | 84.9 |
| Ex. 5 | 91.7 | 56.9 |

INDUSTRIAL APPLICABILITY

The imprinting mold of the present invention is useful as a mold to be used for an imprinting method, particularly for a nano imprinting method.

The entire disclosure of Japanese Patent Application No. 2007-028268 filed on Feb. 7, 2007 including specification, claims, drawings and summary is incorporated herein by reference in its entirety.

What is claimed is:

1. An imprinting mold comprising a mold body and a coating layer made of a release agent, formed on the surface of the mold body, wherein the release agent contains a compound of the following formula (1):

wherein R is Rf—X—, both R are the same group, Rf is a $C_{1-20}$ perfluoroalkyl group, X is a group consisting of at least one member selected from repeating units of the following formulae (u1) to (u3), provided that the sum of the repeating units is at least 1, Y is an organic group having at least two carbon atoms, an average of n is from 2 to 10, Z is —Si$(R^1)_m(R^2)_{3-m}$, $R^1$ is a hydroxyl group or a hydrolysable group, $R^2$ is a hydrogen atom or a monovalent hydrocarbon group, and m is an integer of from 1 to 3:

$$—(OC_3F_6)— \quad (u1)$$

$$—(OC_2F_4)— \quad (u2)$$

$$—(OCF_2)— \quad (u3)$$

provided that $C_3F_6$ and $C_2F_4$ may be linear or branched.

2. The imprinting mold according to claim 1, wherein the contact angle of the coating layer to water is at least 90°.

3. The imprinting mold according to claim 1, wherein the sum of the repeating units of the above formulae (u1) to (u3) is from 2 to 20.

4. The imprinting mold according to claim 1, wherein Y is a group of the following formula (g1):

5. A process for producing the imprinting mold as defined in claim 1, which comprises a step of cleaning the mold body, a step of forming a film of the release agent on the surface of the mold body, and a step of heating the film of the release agent to form a coating layer.

6. A release agent solution for an imprinting mold, which comprises a compound of the following formula (1) and a solvent:

wherein R is Rf—X—, both R are the same group, Rf is a $C_{1-20}$ perfluoroalkyl group, X is a group consisting of at least one member selected from repeating units of the following formulae (u1) to (u3), provided that the sum of the repeating units is at least 1, Y is an organic group having at least two carbon atoms, an average of n is from 2 to 10, Z is $-Si(R^1)_m(R^2)_{3-m}$, $R^1$ is a hydroxyl group or a hydrolysable group, $R^2$ is a hydrogen atom or a monovalent hydrocarbon group, and m is an integer of from 1 to 3:

$$-(OC_3F_6)- \quad (u1)$$

$$-(OC_2F_4)- \quad (u2)$$

$$-(OCF_2)- \quad (u3)$$

provided that $C_3F_6$ and $C_2F_4$ may be linear or branched.

* * * * *